(12) United States Patent
Regier

(10) Patent No.: US 7,423,480 B2
(45) Date of Patent: Sep. 9, 2008

(54) AC AMPLIFIER FOR PRECISION MEASUREMENT

(75) Inventor: Christopher G. Regier, Austin, TX (US)

(73) Assignee: National Instruments Corporation, Austin, TX (US)

(*) Notice: Subject to any disclaimer, the term of this patent is extended or adjusted under 35 U.S.C. 154(b) by 120 days.

(21) Appl. No.: 11/559,044

(22) Filed: Nov. 13, 2006

(65) Prior Publication Data

US 2008/0111560 A1 May 15, 2008

(51) Int. Cl.
*H03F 1/36* (2006.01)
(52) U.S. Cl. .......................................... 330/83; 330/75
(58) Field of Classification Search .................. 330/83, 330/75, 51, 98, 150
See application file for complete search history.

(56) References Cited

U.S. PATENT DOCUMENTS

| | | | |
|---|---|---|---|
| 4,145,661 A | 3/1979 | Wong | |
| 4,387,345 A | 6/1983 | Kelley | |
| 4,604,584 A | 8/1986 | Kelley | |
| 5,107,079 A * | 4/1992 | Hoendervoogt et al. .. | 178/20.02 |
| 5,231,627 A * | 7/1993 | Paul et al. .................... | 369/125 |
| 5,251,260 A * | 10/1993 | Gates .......................... | 381/18 |
| 5,467,056 A | 11/1995 | Goumaz | |
| 5,574,403 A | 11/1996 | Kolluri | |
| 6,011,437 A | 1/2000 | Sutardja et al. | |
| 6,281,752 B1 | 8/2001 | Stochino | |
| 6,452,152 B1 | 9/2002 | Yang | |
| 6,642,795 B2 | 11/2003 | Koen et al. | |
| 6,943,626 B2 | 9/2005 | Comer et al. | |

* cited by examiner

*Primary Examiner*—Henry K Choe
(74) *Attorney, Agent, or Firm*—Meyertons Hood Kivlin Kowert & Goetzel, P.C.; Jeffrey C. Hood

(57) ABSTRACT

A front-end circuit suitable for digital multimeters and measurement devices may be configured with strictly capacitive attenuators replacing the resistive attenuators in the AC signal path. An inverting programmable-gain amplifier (PGA) may be built around an operational amplifier (op-amp), with a single resistor for DC feedback providing a $1^{st}$-order response for AC coupling. The single resistor may be replaced by a more complex RC network to provide a $2^{nd}$-order response. The feedback circuit may also include active components such as additional op-amps, which may assist in shaping the overall response and/or reducing the DC offset at the output of the circuit. The capacitive load presented to the input by the front-end circuit may be minimized to compare to capacitances present in resistive implementations. The circuit would not present a DC load to the input since DC loads are typically the result of a resistive attenuator in the DC signal path.

27 Claims, 3 Drawing Sheets

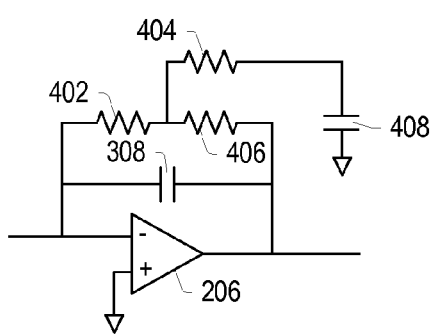 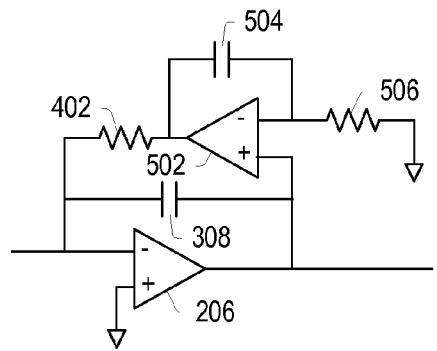
FIG. 4          FIG. 5
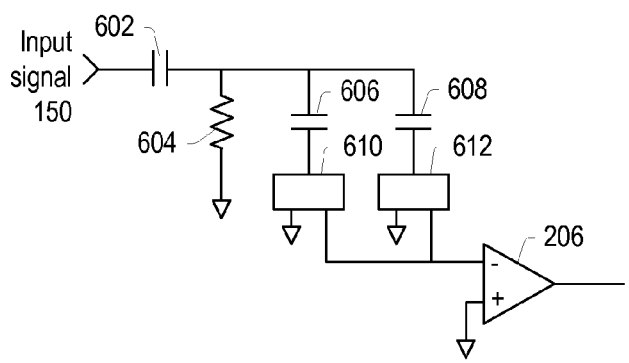
FIG. 6
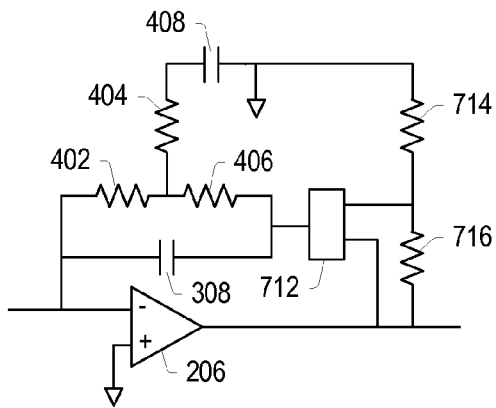 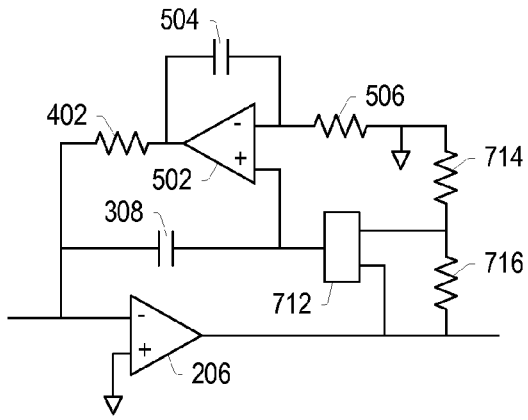
FIG. 7          FIG. 8

AC AMPLIFIER FOR PRECISION MEASUREMENT

BACKGROUND OF THE INVENTION

1. Field of the Invention

This invention relates generally to amplifier design and, more particularly, to the design of AC amplifiers used in performing precision measurements.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate UUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications.

Typically, digital multimeters (DMMs) and other measurement instruments comprised in DAQ devices are required to measure AC signals with a high degree of accuracy over a wide range of signal levels and frequencies. Oftentimes the measured signal is small relative to the dynamic range that is typical of ADCs. That is, the measured signal may have a small dynamic range, for example on the order of tens of mV in some systems. In other cases the measured signal may need to be attenuated, as it may be too high for the given ADC. Therefore it is generally required to further process the measured signal in order to match the dynamic range of ADCs. To achieve this, the measurement instruments may include switchable attenuators and amplifiers to scale the measured signal to a level appropriate for the ADC or RMS-to-DC converter used in the measurement. Characteristically, these attenuators and amplifiers are expected to not present a heavy load to the signal source while preserving the frequency content of the signal. Maintaining a desired frequency response in a high-impedance (1 MΩ or higher) environment presents a sizeable challenge in DMM design. The problem may be especially acute considering the need to attenuate a measured signal before buffering, when high voltage levels are involved.

A typical front end for a DMM may include a switchable precision 1 MΩ or 10 MΩ resistive divider incorporated into the AC signal path, as shown in FIG. 1. The resistive divider comprises resistors 114 and 112, coupled to a programmable gain amplifier (PGA) 102 via high-voltage switch 106, with the output of PGA 106 coupled to RMS measurement circuit 104. Input signal 150 coming into the circuit is coupled to the resistive divider via DC coupling switch 118 having an AC coupling capacitor 116 across its terminals. In this case, the parasitic capacitances (110a and 110b) of the divider make it difficult to achieve a flat frequency response, and some adjustment is required, implemented here by way of an adjustable capacitor 108 to provide compensation for the parasitic capacitance (110a and 110b).

As shown in FIG. 2, other DMM designs may feature completely separate DC and AC signal paths, using a separate 1 MΩ resistor 216 for the AC path coupling to the input of an inverting amplifier 206 configured with feedback resistor 204. This reduces the parasitic capacitance (210), though typically not enough to obviate the need for adjustment, implemented here by way of an adjustable capacitor 208 configured to provide compensation for the parasitic capacitance (210). Furthermore, the fact that all input signals, not just the large ones, may pass through the 1 MΩ resistor leads to increased noise on the more sensitive AC voltage ranges. In addition, the selected value of resistor 204 needs to be precise, since it is configured to set the gain of the circuit shown in FIG. 2.

In both approaches (shown in FIG. 1 and FIG. 2, respectively), the interaction of high resistance values with small, sometimes unintended capacitances typically results in frequency response aberrations. Presently, a variety of techniques may be used to compensate for these aberrations. These typically include canceling zeroes with adjustable poles (and vice-versa) using electronic trim-pots and DACs, and compensating for frequency response errors using digital signal processing. However, the use of these techniques generally adds complexity and increases the cost of DMM and/or measurement products.

Another drawback of most current solutions is the presence of the requisite first-order response of the AC coupling. This response does not allow for a sufficient tradeoff between settling time and a flat response at low frequencies. Sometimes the low-frequency response is corrected based on a measurement of the input frequency, further increasing circuit complexity, and subject to errors when presented with complex input signals.

Thus, there it would be beneficial to provide a simple adjustment-free AC front-end circuit for DMMs and other precision measurement devices that accommodates both low- and high-level input signals with a flat frequency response and relatively fast settling time. Other corresponding issues related to the prior art will become apparent to one skilled in the art after comparing such prior art with the present invention as described herein.

SUMMARY OF THE INVENTION

In one set of embodiments, a front-end circuit suitable for DMMs and measurement devices may be configured to eliminate the resistive attenuator from the AC signal path common in present day DMMs and measurement systems, replacing it instead with a strictly capacitive attenuator. In a preferred embodiment, an inverting programmable-gain capacitive amplifier (PGA) may be built around an operational amplifier (op-amp), with a single resistor for DC feedback providing a $1^{st}$-order response for AC coupling. This may provide a very broad bandwidth, as there may be no significant parasitic resistances shunting the capacitors, unlike the parasitic capacitances that typically shunt the resistors in a resistive circuit In addition, the use of capacitors may increase signal current at high frequencies, thereby improving bandwidth.

The bandwidth may however be limited at both high and low frequencies. At high frequencies, the bandwidth may be limited by the resistance of the gain-selection switches and by the finite bandwidth of the op-amp. At low frequencies, the bandwidth may be limited by the need to provide DC feedback around the op-amp. The DC feedback may be a simple high-value resistor operable to provide a $1^{st}$-order response (as previously mentioned), or a more complex RC network operable to provide a $2^{nd}$-order response. The feedback circuit may also include active components such as additional op-amps, which may assist in shaping the overall response and/or substantially reducing and/or eliminating the DC offset at the output of the circuit. The capacitive load that the circuit may present to the input signal may be minimized to be comparable to the capacitance present in prior-art implementations. In addition, no DC load may be presented to the input signal by the circuit. Any DC load that may be present would result from a resistive attenuator present only in the DC signal path.

Various embodiments of the circuit may be realized. As previously mentioned, in one set of embodiments DC feedback may be achieved using a single resistor for providing a $1^{st}$-order response for AC coupling. In a second set of embodiments, the single resistor may be replaced with an RC network that may provide a $2^{nd}$-order response for AC coupling. In a third set of embodiments, the RC network may be replaced with an op-amp-based circuit operable to provide a $2^{nd}$-order response while reducing the offset voltage at the output. In a fourth set of embodiments, the input capacitors may be replaced with a capacitive network to yield more manageable values. An additional resistor may be used to define the DC potential at the junction of the capacitors comprised in the capacitive network, while raising the order of the response for AC coupling by one.

In some embodiments, the programmable gain (for the PGA based design) may be implemented in conjunction with the RC network without requiring an additional op-amp stage. In other embodiments, the programmable gain may actually be built into the first op-amp stage in conjunction with the op-amp-based feedback circuit included in the third set of embodiments mentioned above.

Key benefits of various embodiments may be summarized to include high bandwidth without circuit adjustment or compensation, no DC load on the input signals, $2^{nd}$-order response for AC coupling, gain-independent input capacitance, flat frequency response unaffected by parasitic capacitance/resistance variation, low sensitivity to lead reversal, no high-voltage switching required for AC range selection, and finally, simplicity of design and low cost.

Overall, many variations to the basic architecture described above are possible, and any and all such variations will be apparent to those skilled in the art.

BRIEF DESCRIPTION OF THE DRAWINGS

The foregoing, as well as other objects, features, and advantages of this invention may be more completely understood by reference to the following detailed description when read together with the accompanying drawings in which:

FIG. 4 shows a portion of the circuit shown in FIG. 3, with the single resistor replaced with an RC network to provide a $2^{nd}$-order response for AC coupling, according to one embodiment;

FIG. 5 shows a portion of the circuit shown in FIG. 3, with the single resistor replaced with an op-amp based feedback circuit to provide a $2^{nd}$-order response for AC coupling while reducing output offset voltage, according to one embodiment;

FIG. 6 shows a portion of the circuit shown in FIG. 3, with the input capacitors replaced with a capacitive network to yield more manageable values, according to one embodiment;

FIG. 7 shows one embodiment of the programmable gain of FIG. 3 implemented in conjunction with the RC feedback of FIG. 4 without requiring an additional op-amp stage;

FIG. 8 shows one embodiment of the programmable gain built into the first op-amp stage in conjunction with the op-amp based feedback of FIG. 5;

Figure 1:
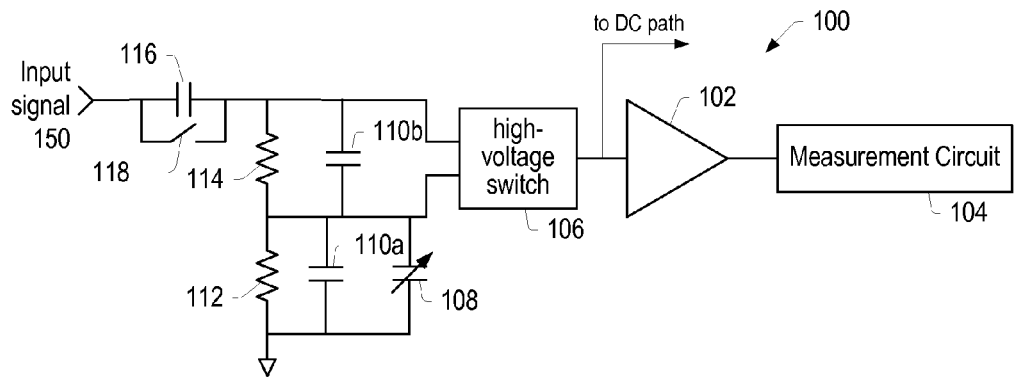
FIG. 1 shows the circuit diagram for the front end of a digital multimeter (DMM) comprising a switchable precision 1 MΩ or 10 MΩ resistive divider, according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

As used herein, a "resistive terminal" of a given circuit is meant to denote a terminal of the circuit, having two ends, where one end is coupled to a resistive element comprised within the given circuit, and the other end is configured to couple to any other circuit and/or circuit component, internal or external to the given circuit. Similarly, "capacitive terminal" of a given circuit is meant to denote a terminal of the circuit, having two ends, where one end is coupled to a capacitive element comprised within the given circuit, and the other end is configured to couple to any other circuit and/or circuit component, internal or external to the given circuit.

Figure 3:
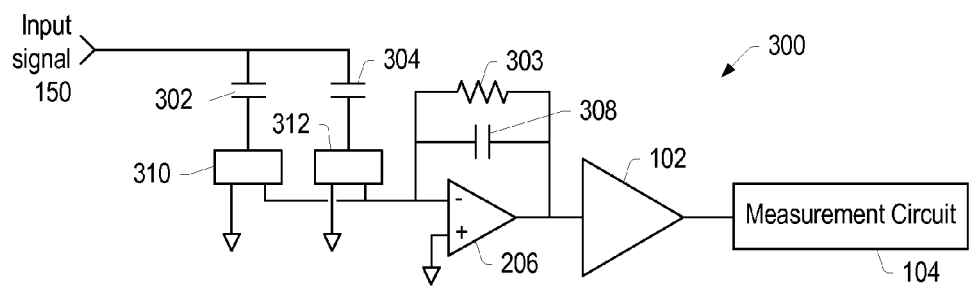
FIG. 3 shows the circuit diagram for the front end of a DMM comprising an inverting programmable-gain capacitive amplifier built around an operational amplifier (op-amp) and featuring a single resistor for DC feedback providing a $1^{st}$-order response for AC coupling, according to one embodiment.

A front-end circuit suitable for digital multimeters (DMMs) and measurement devices may be configured to eliminate resistive attenuators from the AC signal path, replacing them with strictly capacitive attenuators. FIG. 3 shows the circuit diagram for the front end of a measurement system 300, which may be a DMM that includes a measurement circuit 104. The front-end circuit may comprise an inverting programmable-gain capacitive amplifier built around an amplifier, which may be an operational amplifier (op-amp) 206, and featuring a single resistor 303 for DC feedback providing a $1^{st}$-order response for AC coupling, setting the AC cutoff frequency. As seen in FIG. 3, no resistive attenuator is present in the AC signal path for input signal 150. Instead, a switchable, strictly capacitive attenuator circuit may be used. In one embodiment, the switchable capacitive attenuator circuit comprises capacitors 302 and 304 each coupled to the input terminal of the front-end circuit, and switches 310 and 312 coupled to capacitors 302 and 304, respectively. Switches 310 and 312 may be configured to selectively couple capacitors 302 and 304, respectively, to the inverting input of op-amp 206, to set the gain of the front-end circuit.

Figure 2:
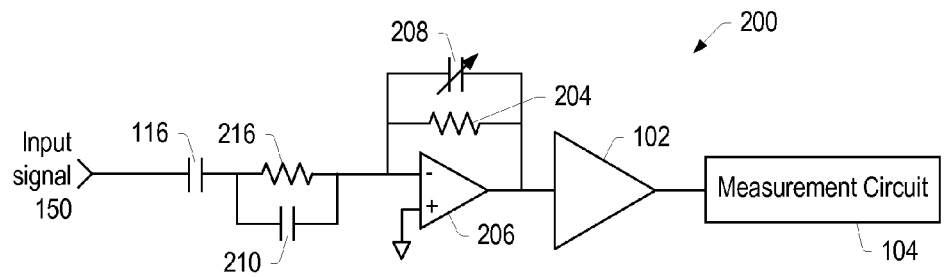
FIG. 2 shows the circuit diagram for the front end of a DMM comprising separated DC and AC Signal paths, according to prior art.

Measurement system 300 may theoretically operate at a very broad bandwidth, as no significant parasitic resistances may be shunting capacitors 302 and 304, unlike parasitic capacitances 100a and 110b shunting resistors 112 and 114, respectively, shown in FIG. 1, or parasitic capacitance 210 shunting resistor 216, shown in FIG. 2. Additionally, the use of capacitors 302 and 304 may increase signal current at high frequencies, which may improve bandwidth. However, the bandwidth of the measurement system may be limited at both high and low frequencies. At high frequencies, the bandwidth may be limited by the resistance of gain-selection switches 310 and 312, and by the finite bandwidth of op-amp 206. At low frequencies, the bandwidth may be limited by resistor 303, which provides needed DC feedback around the op-amp. In addition, the values of capacitors 302 and 304 may be selected by taking into account that both capacitors 302 and 304 may possibly be exposed to high input voltages if/when input signal 150 has a high voltage value. Therefore, depending on the expected voltage levels of input signal 150, capacitors 302 and 304 may be designated as high-voltage capacitors in some embodiments.

As previously mentioned, one DC feedback circuit may comprise resistor 303 coupled in parallel with capacitor 308, as shown in FIG. 3, to provide a $1^{st}$-order response for AC coupling. FIG. 4 shows a portion of the circuit shown in FIG. 3, with the single resistor 303 replaced with an RC network comprising resistors 402 and 406 coupled in series between the inverting terminal and the output of op-amp 206, and resistor 404 and capacitor 408 coupled in series between the common node of resistors 402 and 406 and a reference voltage, which may be ground. This RC network may be operable to effectively allow for a $2^{nd}$-order response for AC coupling as opposed to the $1^{st}$-order response allowed by single resistor 303.

In one set of embodiments, the DC feedback circuit may contain active components such as additional op-amps, which may be useful in shaping the overall response and/or in more effectively eliminating DC offset at the output of op-amp 206. FIG. 5 shows a portion of the circuit shown in FIG. 3, with single resistor 303 replaced with an op-amp based feedback circuit to provide a $2^{nd}$-order response for AC coupling while reducing offset voltage at the output of op-amp 206. Thus, in addition to capacitor 308, the DC feedback circuit may comprise an amplifier, such as op-amp 502, with resistor 402 coupling the output of op-amp 502 to the inverting input of op-amp 206. Feedback for op-amp 502 may be provided by capacitor 504, with the inverting terminal of op-amp 502 coupled to a reference voltage, in this case ground, via resistor 506 and the non-inverting terminal of op-amp 502 closing the feedback loop for op-amp 206 by coupling to the output of op-amp 206.

It should be noted that while the front-end circuit does provide a capacitive load to input signal 150, the front-end circuit may be configured/designed such that this capacitive load is small enough to compare to the capacitive load found in other implementations, more specifically in implementations that are configured with a resistive attenuator in the AC signal path. The front-end circuit may also be configured to provide no DC load to input signal 150. Any DC load present may result solely from a resistive attenuator in the DC signal path.

FIG. 6 shows the gain selection portion of the circuit shown in FIG. 3, with input capacitors 302 and 304 replaced with a capacitive network to yield more manageable values for capacitors 602, 606 and 608. In one set of embodiments, capacitor 302 and 304 may have values in the 1 pF and 100 pF range, respectively, to obtain the desired gain control. Capacitors 606 and 608 may have values in the 10 pF and 1 nF range, respectively, with capacitor 602 having a value in the 100 pF range. Additional resistor 604 may define the DC potential at the common node where capacitors 602, 606 and 608 are coupled together, while raising by one the order of the response for AC coupling. Thus, for example, using the gain selection circuit shown in FIG. 6, in combination with the DC feedback circuit shown in FIGS. 4 and/or 5, the front-end circuit may be operable to provide a $3^{rd}$-order response for AC coupling. As configured in the embodiment shown in FIG. 6, only capacitor 602 may be exposed to a maximum input voltage (a maximum voltage value of input signal 150), therefore the embodiment of FIG. 6 may require fewer high-voltage capacitors than the embodiment shown in FIG. 3.

FIG. 7 shows one embodiment of a programmable gain feedback (PGF) circuit implementing the programmable gain presented in FIG. 3 in conjunction with the RC feedback presented in FIG. 4, without requiring an additional op-amp stage. In this embodiment, the RC feedback network and feedback capacitor of FIG. 4—comprising resistors 402, 404, and 406, and capacitors 308 and 408—are driven by either the output of op-amp 206 or by an attenuated feedback signal, which may be an attenuated version of the output of op-amp 206 obtained from the junction of resistors 714 and 716. Switch 712 may be configured to select between the output of op-amp 206 and the junction of resistors 714 and 716. When the attenuated feedback signal is chosen, the output of the opamp is forced to be larger to overcome the attenuator in the feedback path, effecting an increase in gain. In one set of embodiments, resistors 714 and 716 may have values in the 100Ω and 900Ω range, respectively, to effect a switchable gain of 10. These low values would have a minimal effect on the frequency response of the entire circuit, making it simple and easy to achieve a flat frequency response without requiring any special tuning and/or adjustment.

FIG. 8 shows another embodiment of a PGF circuit, in which the programmable gain built into the first op-amp stage (presented in FIG. 7) is implemented in conjunction with the op-amp based feedback shown in FIG. 5. In this embodiment, the op-amp based feedback network and feedback capacitor of FIG. 5—comprising op-amp 502, resistors 402 and 506, and capacitors 308 and 504—are driven by either the output of op-amp 206 or by an attenuated feedback signal, which may again be an attenuated version of the output of op-amp 206 obtained from the junction of resistors 714 and 716. Switch 712 may again be configured to select between the output of op-amp 206 and the junction of resistors 714 and 716. When the attenuated feedback signal is chosen, the output of the op-amp may be forced to be larger to overcome the attenuator in the feedback path, effecting an increase in gain.

In one set of embodiments, resistors 714 and 716 may have values in the 100Ω and 900Ω range, respectively, similar to the circuit shown in FIG. 7, to effect a switchable gain of 10. As in FIG. 7, these low values will have a minimal effect on the frequency response of the entire circuit, making it simple and easy to achieve a flat frequency response without requiring any special tuning and/or adjustment.

Figure 9:
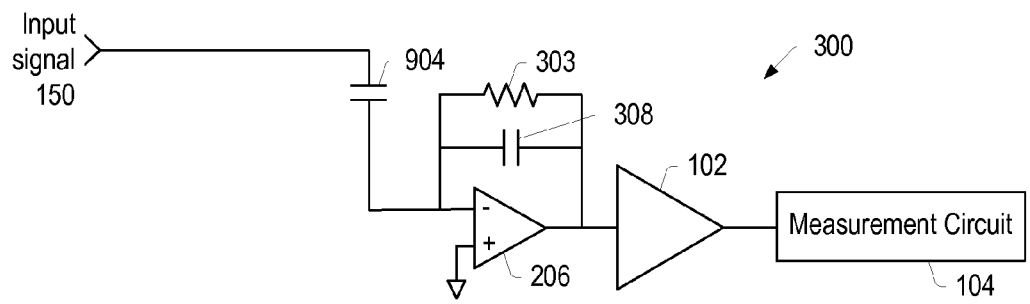
FIG. 9 shows the circuit diagram for the front end of a DMM comprising an inverting gain capacitive amplifier built around an operational amplifier (op-amp), featuring a single input capacitor and a single resistor for DC feedback providing a $1^{st}$-order response for AC coupling, according to one embodiment.

FIG. 9 shows an alternate embodiment of the circuit diagram shown in FIG. 3. In the alternate embodiment of FIG. 9, the capacitor switching network—comprising capacitors 302 and 304, and switches 310 and 312—shown in FIG. 3 has been replaced by a single input capacitor 904. This may provide an op-amp based capacitive attenuator with no selection of the input capacitor. While this may provide a capacitive attenuator circuit, as opposed to the resistive attenuator circuit of FIG. 1, even small signals may get attenuated. In some embodiments, attenuation of even small signals may possibly be avoided by configuring switchable capacitors—not shown in FIG. 9—in the feedback path of op-amp 206.

Figure 10:
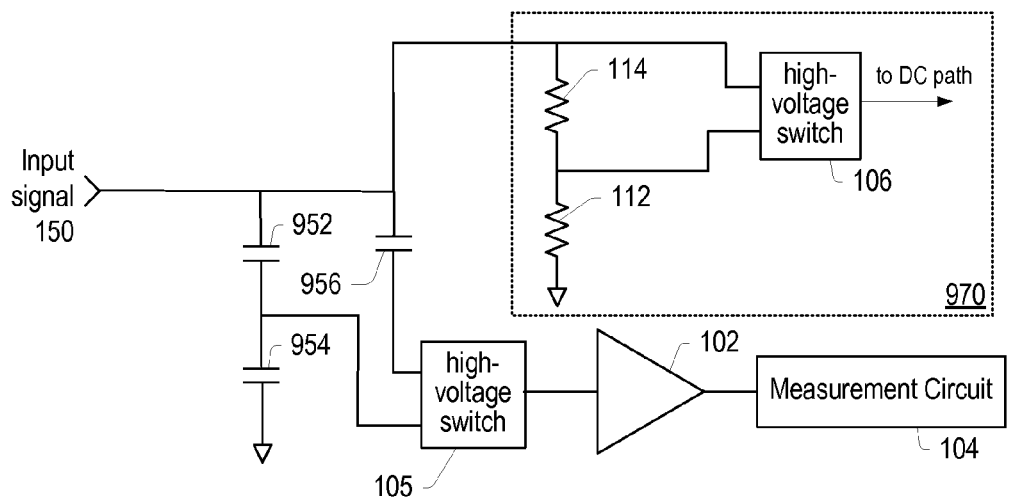
FIG. 10 shows the front end circuit for a measurement system, in which a non op-amp-based capacitive attenuator may be used completely independently of a resistive attenuator that is used for the DC path, according to one embodiment.

FIG. 10 shows yet another embodiment of a front end circuit for a measurement system, in which a non op-amp-based capacitive attenuator may be used completely independently of a resistive attenuator that is used for the DC path. In the embodiment of FIG. 10, a non op-amp-based attenuator (divider) circuit similar to the resistive attenuator circuit shown in FIG. 1 may be configured as a completely capacitive attenuator (divider) circuit used for the AC path and comprising capacitors 952 and 954, and capacitor 956. The AC portion of Input signal 150 coming into the circuit may be coupled to amplifier 102 via capacitor 956, or an attenuated version of the AC portion of input signal 150 may be coupled to amplifier 102 from the junction of capacitors 952 and 954. Switch 105 may be configured to select between the non-attenuated and attenuated version of the AC portion of input signal 150. An attenuator circuit 970 may be independently configured for the DC path, using a circuit similar to that shown in FIG. 1. Attenuator circuit 970 may thus be configured as a resistive attenuator (divider) comprising resistors 114 and 112. The DC portion of Input signal 150 may be coupled to the DC path via switch 106, which may be configured to couple either a non-attenuated version of the DC portion of Input signal 150, or an attenuated version thereof from the junction of resistors 114 and 112.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the Invention may be utilized independently, all as would be apparent to one skilled in the art after having the benefit: of this description of the invention. Changes may be made in the elements described herein without departing from the spirit and scope of the invention as described in the following claims.

I claim:

1. A front-end circuit for a measurement circuit, the front-end circuit comprising:
   an input terminal configured to receive input signals;
   a first amplifier having a pair of differential inputs and an output, wherein the output of the first amplifier is configured to couple to an input of the measurement circuit, and wherein a first one of the pair of differential inputs of the first amplifier is coupled to a reference voltage;
   a feedback circuit coupled between the second one of the pair of differential inputs of the first amplifier and the output of the first amplifier, and operable to provide at least a $1^{st}$-order response for AC coupling; and
   a capacitive input circuit having an input coupled to the input terminal of the front-end circuit, and an output coupled to the second one of the pair of differential inputs of the first amplifier, and operable to control a value of a voltage developed at the output of the first amplifier according to the input signals, without requiring compensation for parasitic resistance and/or parasitic capacitance while achieving a flat frequency response.

2. The front-end circuit of claim 1, wherein the feedback circuit comprises a capacitor and a resistor coupled in parallel between the second one of the pair of differential inputs of the first amplifier and the output of the first amplifier to have the feedback circuit provide a $1^{st}$-order response for AC coupling.

3. The front-end circuit of claim 1, wherein the feedback circuit comprises:
   a capacitor coupled between the second one of the pair of differential inputs of the first amplifier and the output of the first amplifier; and
   an RC network having two resistive terminals coupling the RC network between the second one of the pair of differential inputs of the first amplifier and the output of the first amplifier, and a capacitive terminal coupling the RC network to the reference voltage;
   wherein the feedback circuit is operable to provide a $2^{nd}$-order response for AC coupling.

4. The front-end circuit of claim 3, wherein the RC network comprises:

a first and a second resistor coupled in series between the two resistive terminals of the RC network;

a third resistor having one of two terminals coupled to a common node of the first and second resistor; and a capacitor having one of two terminals coupled to the other one of the two terminals of the third resistor, wherein the other one of the two terminals of the capacitor is configured as the capacitive terminal of the RC network.

5. The front-end circuit of claim 1, wherein the capacitive input circuit comprises:

a first node coupled to the input terminal of the front-end circuit;

a first and a second capacitor each having two terminals with a first one of the two terminals coupled to the first node; and a first switch corresponding to the first capacitor and a second switch corresponding to the second capacitor, each switch operable to selectively couple its corresponding capacitor via the second one of the two terminals of the corresponding capacitor to the second one of the pair of differential inputs of the second amplifier.

6. The front-end circuit of claim 5, wherein the first and the second switch are low-voltage switches, each operable to selectively couple its corresponding capacitor via the second one of the two terminals of the corresponding capacitor to either the reference voltage or to the second one of the pair of differential inputs of the second amplifier.

7. The front-end circuit of claim 5, wherein the first and the second capacitor have substantially different values.

8. The front-end circuit of claim 5, wherein the capacitive input circuit further comprises;

a third capacitor coupled between the input terminal of the front-end circuit and the first node;

a resistor coupled between the first node and the reference voltage and operable to define a DC potential at the first node, and further operable to raise an order of the response for AC coupling by one.

9. The front-end circuit of claim 1, wherein the feedback circuit comprises:

a second amplifier having an output and a pair of differential inputs, wherein a first one of the pair of differential inputs of the second amplifier is coupled to the output of the first amplifier;

a first capacitor coupled between the second one of the pair of differential inputs of the first amplifier and the output of the first amplifier;

a second capacitor coupled between the output of the second amplifier and a second one of the pair of differential inputs of the second amplifier;

a first resistor coupled between the output of the second amplifier and the second one of the pair of differential inputs of the first amplifier; and a second resistor coupled between the second one of the pair of differential inputs of the second amplifier and the reference voltage;

wherein the feedback circuit is operable to provide a $2^{nd}$-order response for AC coupling while reducing offset voltage at the output of the first amplifier.

10. The front-end circuit of claim 9, wherein the first amplifier and the second amplifier are operational amplifiers, wherein the first one of the pair of differential inputs of each amplifier is a non-inverting input and the second one of the pair of differential inputs of each amplifier is an inverting input.

11. The front-end circuit of claim 1, wherein the first one of the pair of differential inputs of the first amplifier is a non-inverting input, and the second one of the pair of differential inputs of the first amplifier is an inverting input.

12. The front-end circuit of claim 1, wherein the reference voltage is ground.

13. The front-end circuit of claim 1, wherein the first amplifier is an operational amplifier (op-amp).

14. A front-end circuit for a measurement circuit, the front-end circuit comprising:

an input terminal configured to receive input signals;

a first amplifier having a pair of differential inputs and an output, wherein the output of the first amplifier is configured to couple to an input of the measurement circuit, and wherein a first one of the pair of differential inputs of the first amplifier is coupled to a reference voltage;

a programmable gain feedback circuit: coupled between the second one of the pair of differential inputs of the first amplifier and the output of the first amplifier, and operable to provide at least a $1^{st}$-order response for AC coupling, and further operable to control a value of a voltage developed at the output of the first amplifier according to the input signals, without requiring compensation for parasitic resistance and/or parasitic capacitance while achieving a flat frequency response.

15. The front-end circuit of claim 14, wherein the programmable gain feedback circuit comprises:

a capacitor coupled between the second one of the pair of differential inputs of the first amplifier and a first node;

an RC network having two resistive terminals coupling the RC network between the second one of the pair of differential inputs of the first amplifier and the first node, and a capacitive terminal coupling the RC network to the reference voltage, wherein the RC network is operable to provide a $2^{nd}$-order response for AC coupling, and a switchable resistive attenuator circuit having a first terminal coupled to the first node, a second terminal coupled to the reference voltage, and third and fourth terminals coupled to the output of the first amplifier, and operable to control a value of a voltage developed at the output of the first amplifier according to the input signals.

16. The front-end circuit of claim 15, wherein the RC network comprises:

a first and a second resistor coupled in series between the two resistive terminals of the RC network;

a third resistor having one of two terminals coupled to a common node of the first and second resistor; and a capacitor having one of two terminals coupled to the other one of the two terminals of the third resistor, wherein the other one of the two terminals of the capacitor is configured as the capacitive terminal of the RC network.

17. The front-end circuit of claim 15, wherein the switchable resistive attenuator circuit comprises:

a first resistor having a first terminal coupled to the reference voltage and a second terminal coupled to a second node;

a second resistor having a first terminal coupled to the second node and a second terminal coupled to the output of the first amplifier; and a switch operable to selectively couple the first node to either the second node or to the output of the first amplifier.

18. The front-end circuit of claim 14, wherein the programmable gain feedback circuit comprises:

a second amplifier having an output and a pair of differential inputs, wherein a first one of the pair of differential inputs of the second amplifier is coupled to a first node;

a first capacitor coupled between the second one of the pair of differential inputs of the first amplifier and the first node;

a second capacitor coupled between the output of the second amplifier and a second one of the pair of differential inputs of the second amplifier;

a first resistor coupled between the output of the second amplifier and the second one of the pair of differential inputs of the first amplifier;

a second resistor coupled between the second one of the pair of differential inputs of the second amplifier and the reference voltage; and a switchable resistive attenuator circuit having a first terminal coupled to the first node, a second terminal coupled to the reference voltage, and third and fourth terminals coupled to the output of the first amplifier, and operable to control a value of a voltage developed at the output of the first amplifier according to the input signals;

wherein the programmable gain feedback circuit is operable to provide a $2^{nd}$-order response for AC coupling while reducing offset voltage at the output of the first amplifier.

19. The front-end circuit of claim 18, wherein the switchable resistive attenuator circuit comprises:

a first resistor having a first terminal coupled to the reference voltage, and having a second terminal coupled to a second node;

a second resistor having a first terminal coupled to the second node, and having a second terminal coupled to the output of the first amplifier; and a switch operable to selectively couple the first node to either the second node or to the output of the first amplifier.

20. A system comprising:

a converter circuit having an input operable to receive AC signals;

a first amplifier having an input and an output, the output coupled to the input of the converter circuit; and a front-end circuit comprising:

an input terminal configured to receive AC input signals;

a second amplifier having a pair of differential inputs and an output, wherein the output of the second amplifier is configured to couple to an input of the first amplifier, and wherein a first one of the pair of differential inputs of the second amplifier is coupled to a reference voltage;

a feedback circuit coupled between the second one of the pair of differential inputs of the second amplifier and the output of the second amplifier, and operable to provide at least a $1^{st}$-order response for AC coupling; and a capacitive input circuit having an input coupled to the input terminal of the front-end circuit, and an output coupled to the second one of the pair of differential inputs of the second amplifier;

wherein the front-end circuit and the first amplifier form a control circuit, which is operable to scale the AC input signals to a level appropriate for the converter circuit, without requiring adjustment for parasitic resistance and/or parasitic capacitance; and wherein the control circuit is operable to scale the AC input signals for high-level and/or low-level values of the AC input signals, with a flat frequency response and substantially fast settling time.

21. The system of claim 20, wherein the converter circuit is one of:

an analog-to-digital converter (ADC); or a root-mean-square-to-direct-current (RMS-DC) converter.

22. The system of claim 20, wherein the system is operable to measure a value of the AC input signals.

23. A system comprising:

a converter circuit having an input operable to receive AC signals;

a first amplifier having an input and an output, the output coupled to the input of the converter circuit; and a front-end circuit comprising:

an input terminal configured to receive AC input signals;

a second amplifier having a pair of differential inputs and an output, wherein the output of the second amplifier is coupled to an input of the first amplifier, and wherein a first one of the pair of differential inputs of the second amplifier is coupled to a reference voltage;

a programmable gain feedback circuit coupled between the second one of the pair of differential inputs of the second amplifier and the output of the second amplifier, and operable to provide at least a $2^{nd}$-order response for AC coupling, and further operable to control a value of a voltage developed at the output of the second amplifier according to the AC signals, without requiring compensation for parasitic resistance and/or parasitic capacitance while achieving a flat frequency response.

24. A front-end circuit for a measurement circuit, the front-end circuit comprising:

an input terminal configured to receive input signals;

a capacitive attenuator circuit having an input coupled to the input terminal of the front-end circuit and having an output configured to couple to an input of the measurement circuit, and operable to attenuate respective AC portions of the input signals; and a resistive attenuator circuit having an input coupled to the input terminal of the front-end circuit and having an output configured to couple to a DC-path corresponding to the input signals, and operable to attenuate respective DC portions of the input signals;

wherein the capacitive attenuator circuit is operable to control a value of respective AC signals developed at the input of the measurement circuit according to the input signals, wherein the capacitive attenuator circuit is operable to control the value of the respective AC signals independently of the resistive attenuator circuit and without requiring compensation for parasitic resistance and/or parasitic capacitance while achieving a flat frequency response.

25. The front-end circuit of claim 24, wherein the resistive attenuator circuit is operable to control a value of respective DC signals developed at the DC path according to the input signals, wherein the resistive attenuator circuit is operable to control the value of the respective DC signals independently of the capacitive attenuator circuit.

26. The front-end circuit of claim 25, wherein the resistive attenuator circuit comprises:

a switch having a first input, a second input, and an output, wherein the first input of the switch is configured to receive a non-attenuated version of the respective DC portions of the input signals, and wherein the output of the switch is configured as the output of the capacitive attenuator circuit;

a first resistive circuit coupled between the input terminal of the front-end circuit and the second input of the switch, and operable to provide an attenuated version of the respective DC portions of the input signals to the switch;

wherein the switch is operable to select between the non-attenuated version and the attenuated version of the respective DC portions of the input signals to control the value of the respective DC signals developed at the DC path.

27. The front-end circuit of claim 24, wherein the capacitive attenuator circuit comprises:
   a switch having a first input, a second input, and an output, wherein the output of the switch is configured as the output of the capacitive attenuator circuit;
   a first capacitive circuit coupled between the input terminal of the front-end circuit and the first input of the switch, and operable to provide a non-attenuated version of the respective AC portions of the input signals to the switch; and
   a second capacitive circuit coupled between the input terminal of the front-end circuit and the second input of the switch, and operable to provide an attenuated version of the respective AC portions of the input signals to the switch;

wherein the switch is operable to select between the non-attenuated version and the attenuated version of the respective AC portions of the input signals to control the value of the respective AC signals developed at the input of the measurement circuit.

* * * * *

UNITED STATES PATENT AND TRADEMARK OFFICE
CERTIFICATE OF CORRECTION

PATENT NO. : 7,423,480 B2 Page 1 of 1
APPLICATION NO. : 11/559044
DATED : September 9, 2008
INVENTOR(S) : Regier It is certified that error appears in the above-identified patent and that said Letters Patent is hereby corrected as shown below:

In the Claims:

<u>Column 8</u>
Line 46, please delete "fiat" and substitute -- flat --.

<u>Column 12</u>
Line 28, please delete "fiat" and substitute -- flat --.

Signed and Sealed this

Twenty-eighth Day of October, 2008

JON W. DUDAS
*Director of the United States Patent and Trademark Office*